(12) United States Patent
Nomoto et al.

(10) Patent No.: US 6,906,390 B2
(45) Date of Patent: Jun. 14, 2005

(54) NONVOLATILE SEMICONDUCTOR STORAGE AND METHOD FOR MANUFACTURING THE SAME

(75) Inventors: Kazumasa Nomoto, Kanagawa (JP); Hiroshi Aozasa, Tokyo (JP); Ichiro Fujiwara, Kanagawa (JP); Shinji Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 71 days.

(21) Appl. No.: 10/169,022

(22) PCT Filed: Oct. 25, 2001

(86) PCT No.: PCT/JP01/09391

§ 371 (c)(1),
(2), (4) Date: Nov. 12, 2002

(87) PCT Pub. No.: WO02/35610

PCT Pub. Date: May 2, 2002

(65) Prior Publication Data

US 2003/0122204 A1 Jul. 3, 2003

(30) Foreign Application Priority Data

Oct. 26, 2000 (JP) .......................................... 2000-327725
Mar. 30, 2001 (JP) .......................................... 2001-100264

(51) Int. Cl.$^7$ .............................................. H01L 29/72
(52) U.S. Cl. ...................... 257/406; 257/315; 257/59; 257/296; 257/60; 257/325
(58) Field of Search ........................... 257/59, 60, 296, 257/315, 325, 406

(56) References Cited

FOREIGN PATENT DOCUMENTS

| JP | 58-54674 | * 3/1983 |
|---|---|---|
| JP | 60-60770 | 4/1985 |
| JP | 63-205965 | 8/1988 |
| JP | 5-343694 | 12/1993 |
| JP | 6-296029 | 10/1994 |
| JP | 9-153492 | 6/1997 |

OTHER PUBLICATIONS

Charge Injection and Retention Characteristic of MNOS Structure With Double SiN Layer; Tashong Kim and Kazunori Ohnishi; Denishi Johno Tsushin Gekkai Ronbun-ishi C–II, vol. J74–C–11, No. 8, pp. 662–664.

* cited by examiner

Primary Examiner—Edward Wojciechowicz
(74) Attorney, Agent, or Firm—Sonnenschein, Nath & Rosenthal LLP

(57) ABSTRACT

The memory device has a plurality of dielectric films including charge storage layers CS having a charge holding capability therein and stacked on an active region of a semiconductor SUB and electrodes G on the plurality of dielectric films. Each charge storage layer CS includes a first nitride film CS1 made of silicon nitride or silicon oxynitride and a second nitride film CS2 made of silicon nitride or silicon oxynitride and having a higher charge trap density than the first nitride film CS1. The first nitride film CS1 is formed by chemical vapor deposition using a first gas which contains a first silicon-containing gas containing chlorine with a predetermined percent composition and a nitrogen-containing gas as starting materials. The second nitride film CS2 is formed by chemical vapor deposition using a second gas which contains a second silicon-containing gas having a lower chlorine percent composition than the above predetermined percent composition and a nitrogen-containing gas as starting materials.

12 Claims, 10 Drawing Sheets

NONVOLATILE SEMICONDUCTOR STORAGE AND METHOD FOR MANUFACTURING THE SAME

TECHNICAL FIELD

The present invention relates to a structure and method of fabrication of a charge storage layer of a non-volatile semiconductor memory device as represented by a flash EEPROM (flash electrically erasable and programmable ROM).

BACKGROUND OF THE INVENTION

Information is held in a non-volatile semiconductor memory transistor by storing a charge in a layer of for example polycrystalline silicon sandwiched between silicon dioxide or silicon nitride sandwiched between silicon dioxide on a semiconductor active region in which a channel is to be formed (hereinafter referred to as a "charge storage layer").

Realization of a sufficient charge holding time becomes possible by making the silicon dioxide film on the semiconductor active region side (bottom dielectric film) thick. In general, a bottom dielectric film in an FG (floating gate) type using polycrystalline silicon as the charge storage layer must be formed to at least about 10 nm, while a bottom dielectric film in a MONOS (metal oxide nitride oxide semiconductor) type using a silicon nitride film as the charge storage layer must be formed to at least about 3 nm. Further, the silicon oxide film on the charge storage layer (top dielectric film) needs a thickness great enough to prevent movement of a charge with the gate electrode stacked thereon.

At an input of charge to this charge storage layer, voltage is supplied to the gate electrode to generate a high electric field in the bottom dielectric film. In general, the charge is conducted in the bottom dielectric film and is injected into the charge storage layer by an electric conduction mechanism determined in accordance with the intensity of this electric field and the bottom dielectric film thickness, that is, a direct tunneling phenomenon or FN (Fowler-Nordheim) tunneling phenomenon. The charge injection using this tunneling phenomenon will be referred to as "tunnel injection" below. Tunnel injection is sometimes carried out from the entire surface of the channel or carried out from one or both of the source and drain.

As another representative charge injection method, there is a method of energizing the charge until a barrier height of the bottom dielectric film is exceeded in the semiconductor active region. In the most general method referred to as a "channel hot carrier (hot electron or hot hole) injection", voltage is supplied between the source region and the drain region provided in the semiconductor active region on both sides of the gate electrode and voltage is supplied to the gate electrode to form an inverse layer (channel) between the source and the drain so as to accelerate the carriers supplied from the source side and traveling in the channel. The carriers become hot carriers at the drain end side by receiving energy from the electric field applied in the channel direction. Part thereof exceeds the energy barrier height between the bottom dielectric film and the silicon and is injected into the above charge storage layer.

Note that a method of supplying a high voltage to the source region or drain region and the gate electrode without forming a channel, forcibly inverting a surface portion of that region to generate band-band tunneling, and injecting the high energy charge generated by this into the charge storage layer is also known.

Output of the charge from the charge storage layer can be realized by applying an electric field in an inverse direction to that at the time of the tunnel injection and forcibly draining the charge from the charge storage layer to the channel side. Further, a similar effect to that by draining the charge is obtained also by injecting a charge having an inverse polarity to that of the stored charge into the charge storage layer.

When detecting the presence of a charge or the amount of stored charge in such a charge storage layer, the voltage between the source and drain and the gate voltage are set to predetermined values. When optimizing the bias conditions at this time, a conduction rate of the channel conspicuously changes in accordance with presence of a charge or the amount of stored charge. Accordingly, the presence of a charge or the amount of stored charge in the charge storage layer is effectively converted to an amount of channel current or a change of drain voltage. Detection of the stored information becomes possible by this.

In a conventional MONOS type memory transistor having a charge storage layer made of a single silicon nitride film or silicon oxynitride film, there was a problem that the thickness of the bottom dielectric film could not be reduced to 3 nm or less since the required charge holding time was ensured. Further, the thickness of the dielectric film between the semiconductor active region and the gate electrode can not be reduced by a silicon dioxide conversion, so there was the problem that no progress was made in reduction of the voltage or an increase of the speed.

On the other hand, in a conventional MONOS type memory transistor, the top dielectric film between the gate electrode and the charge storage layer (silicon nitride film) was made of a silicon dioxide film. Hydrogen atoms are apt to be diffused in the silicon dioxide film, so the hydrogen contained in the silicon nitride is diffused in the silicon dioxide and escapes from the silicon nitride film immediately after the fabrication of the element. The amount of the hydrogen bonded with silicon in the silicon nitride film has a positive correlation with the amount of the charge traps. For this reason, when hydrogen escapes from the silicon nitride film immediately after the fabrication of the element, the amount of the charge traps existing in the silicon nitride is decreased. Consequently there was a possibility of occurrence of aging of the device characteristics.

SUMMARY OF THE INVENTION

A first object of the present invention is to provide a non-volatile semiconductor memory device having a charge storage layer structure having an improved charge holding characteristic and a method of producing the same.

A second object of the present invention is to provide a non-volatile semiconductor memory device having a charge storage layer structure capable of achieving a reduction of the voltage and increase of the speed by improving the charge holding characteristic and reducing the thickness of the bottom dielectric film while maintaining the required charge holding time and a method of producing the same.

A third object of the present invention is to provide a non-volatile semiconductor memory device having a charge storage layer structure not reducing the amount of charge traps from a state immediately after formation by sealing in the hydrogen and suppressing the aging of the device characteristics and a method of producing the same.

In order to attain the first object, a method of producing a non-volatile semiconductor memory device of the present invention, comprising a step of forming a plurality of dielectric films containing charge storage layers having a charge holding capability on an active region of a semiconductor and a step of forming electrodes on the plurality of dielectric films, the step of forming the plurality of dielectric films comprising a step of forming a first nitride film by chemical vapor deposition using a first gas which contains a first silicon-containing gas containing a chlorine in a predetermined percent composition and a nitrogen-containing gas as a starting material and a step of forming a second nitride film by chemical vapor deposition using a second gas which contains a second silicon-containing gas with a percent composition of chlorine lower than the predetermined percent composition and a nitrogen-containing gas as the starting material.

To attain the second object, preferably the step of forming the plurality of dielectric films comprises a step of forming a bottom dielectric film on the active region of the semiconductor, the step of forming the first nitride film, the first nitride film is formed on the bottom dielectric film, and in the step of forming the second nitride film, is formed the second nitride film on the first nitride film.

To attain the third object, preferably the step of forming the plurality of dielectric films comprises a step of forming a third nitride film on the second nitride film by chemical vapor deposition using a third gas which contains a third silicon-containing gas having a higher percent composition of chlorine than that of the second silicon containing gas and a nitrogen-containing gas as the starting material, and a step of forming a top dielectric film on the third nitride film.

Further, to attain the first object, a non-volatile semiconductor memory device of the present invention comprises a plurality of dielectric films containing charge storage layers having a charge holding capability inside them and stacked on an active region of a semiconductor and electrodes formed on the plurality of dielectric films, wherein the charge storage layer contains a first nitride film made of silicon nitride or silicon oxynitride and a second nitride film made of silicon nitride or silicon oxynitride and having a charge trap density higher than that of the first nitride film.

To attain the second object, preferably the plurality of dielectric films have bottom dielectric films formed on the active region of the semiconductor, charge storage layers formed on the bottom dielectric films and having the first and second nitride films stacked in that order, and top dielectric films formed on the charge storage layers.

To attain the third object, preferably the charge storage layer has a third nitride film made of silicon nitride or silicon oxynitride and having a charge trap density lower than that of the second nitride film, between the second nitride film and the electrodes.

DETAILED DESCRIPTION OF THE PRESENTLY PREFERRED EMBODIMENTS

Figure 1:
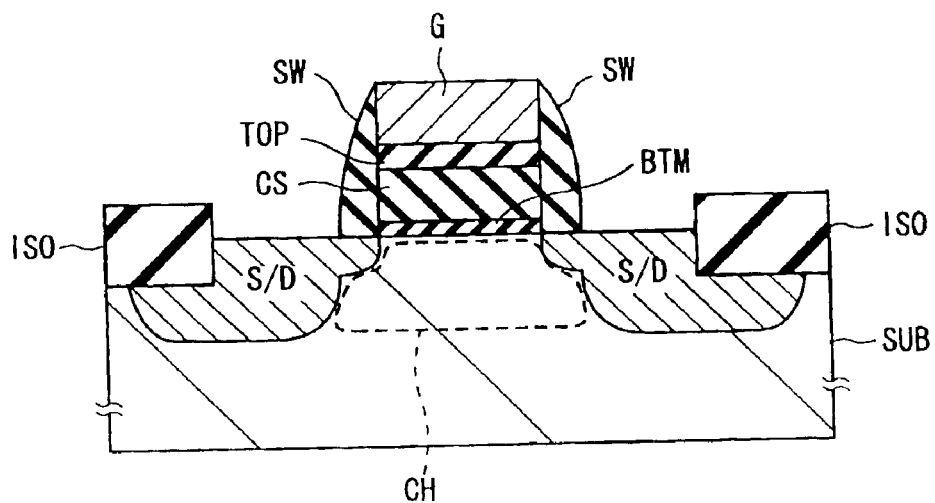
FIG. 1 is a sectional view showing an example of a non-volatile memory transistor according to the present embodiment.

Below, an explanation will be made of embodiments of the present invention by referring to the drawings taking as an example a case where an n-channel type memory transistor is provided as the storage element. Note that, a p-channel type memory transistor is realized by reversing the impurity conductivity type in the following explanation.

First Embodiment

Figure 2:
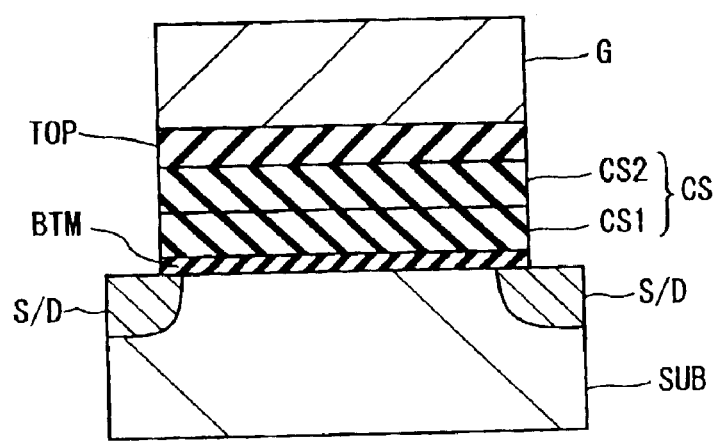
FIG. 2 is a view showing enlarged a first principal part of FIG. 1 showing a detailed example of the structure of a charge storage layer in the memory transistor according to first to third embodiments.

FIG. 1 shows an example of the sectional structure of the non-volatile memory transistor according to the first embodiment. Further, FIG. 2 is a view showing enlarged a principal part of FIG. 1 showing a detailed example of the structure of the charge storage layer.

This memory transistor is formed on for example a p-type silicon wafer or other semiconductor substrate, a p-well formed on the surface inside a semiconductor substrate, or a p-type silicon layer of an SOI type substrate isolation structure (hereinafter simply referred to as a "substrate SUB"). Dielectric isolation layers ISO formed by for example LOCOS (local oxidation of silicon) or STI (shallow trench isolation) is formed on the surface of the substrate SUB according to need. The substrate surface portion on which the dielectric isolation layers ISO are not formed becomes the active region on which the element containing the related memory transistor is to be formed.

On the active region are stacked a bottom dielectric film BTM, charge storage film CS, top dielectric film TOP, and gate electrode G. A word line of the memory cell array is formed by this gate electrode per se or a not illustrated upper interconnection layer connected to the gate electrode G.

The bottom insulation film BMT is comprised of a film of silicon dioxide $SiO_2$ having a thickness of for example about 1 nm to several nm.

The charge storage film CS is comprised of a first nitride film CS1 mainly acting as a potential barrier and a second nitride film CS2 formed on the first nitride film CS1 and mainly acting as a charge storing means as shown in FIG. 2. The first and second nitride films CS1 and CS2 are made of a silicon nitride $SiN_x$ or a silicon oxynitride $SiO_xN_y$ (x, y>0).

The top dielectric film TPO is comprised of a silicon dioxide film fabricated by for example CVD and has a thickness of about 3 nm to 10 nm.

The gate electrode G is comprised of polycrystalline silicon formed by CVD and doped with an impurity doped to a high concentration or a stacked film of the polycrystalline silicon with $WSi_2$, TiN, $TaSi_2$, $TiSi_2$, Ti, W, Cu, Al, Au, or the like formed thereon.

Two source and drain impurity regions S/D having so-called LDDs (lightly doped drains) are formed isolated from each other on the surface in the silicon active region on the two sides of the gate stacked structure having such a configuration. One of these two source and drain impurity regions S/D acts as the source and the other acts as the drain in accordance with the direction of application of the voltage at the time of operation.

Further, insulation layers SW referred to as so-called sidewalls are formed on the two side surfaces of the gate stacked structure. By shallow doping of an n-type impurity into the active region located just under the sidewalls SW to a relatively low concentration, $^-$ impurity regions (LDD) of the source and drain impurity regions S/D are formed. Further, by deeply doping an n type impurity into the two outer sides thereof to a relatively high concentration using the sidewalls SW as self-alignment masks, $n^+$ impurity regions forming the main portions of the source and drain impurity regions S/D are formed.

Note that, the portion of the active region between the two source and drain impurity regions S/D is the channel formation region CH of the related memory transistor.

Below, the method of producing this memory transistor will be explained by referring to the drawings. Here, FIG. 3A to FIG. 3H are sectional views showing an example of the production of a memory transistor according to the first embodiment.

Figure 3A:
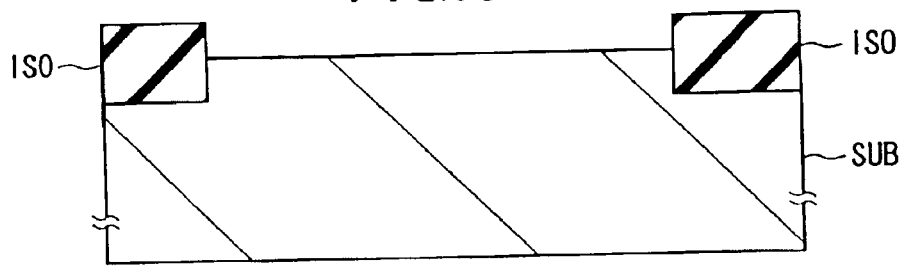
FIG. 3A to FIG. 3H are sectional views showing an example of production steps of the memory transistor according to the present embodiment.

As shown in FIG. 3A, dielectric isolation layers ISO are formed on the substrate SUB by LOCOS or STI. Further, according to need, an impurity is doped for adjusting a threshold voltage of the memory transistor by for example ion injection.

Figure 3B:
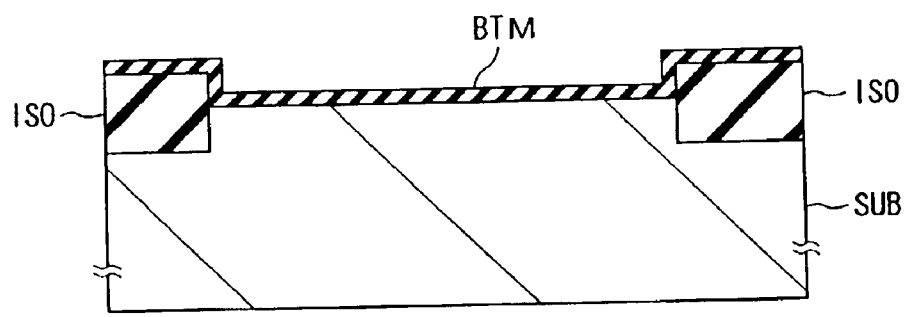

By exposing the surface of the substrate SUB elevated in temperature to 800° C. to 1000° C. to $O_2$ or $N_2O$, a silicon dioxide film of about 1 nm is formed. In a state where the substrate temperature is held at 800° C. to 1000° C., the surface of the silicon dioxide film is exposed to ammonia $NH_3$ for several tens of minutes to nitride the silicon dioxide film surface. This high temperature nitridation is carried out for reducing an incubation time at the time of depositing the next silicon nitride film. By this, as shown in FIG. 3B, a bottom dielectric film BTM of about 1 nm is formed on an Si active region of the substrate SUB.

Figure 3C:
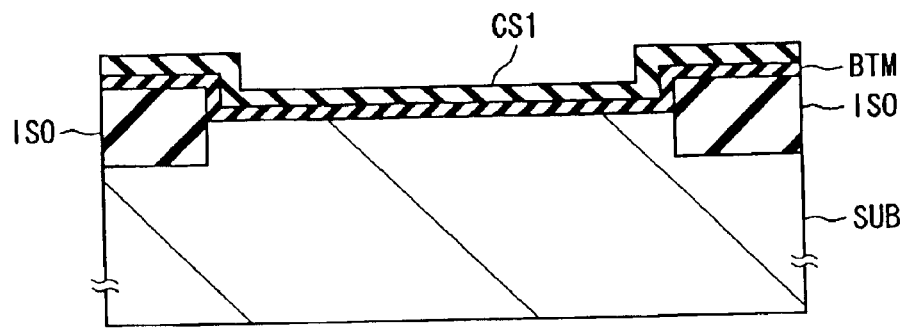

CVD of the silicon nitride is carried out by lowering the substrate temperature to a range of from 600° C. to 800° C. and passing tetrachlorosilane $SiCl_4$ and ammonia $NH_3$ with predetermined flow rates within a range of from 10 sccm to 500 sccm and under a condition that the pressure in the chamber becomes several hundreds of mTorr. When the CVD is stopped after an elapse of the predetermined time, as shown in FIG. 3C, a silicon nitride film (first nitride film CS1) of several nm is formed on the bottom dielectric film BTM.

Figure 3D:
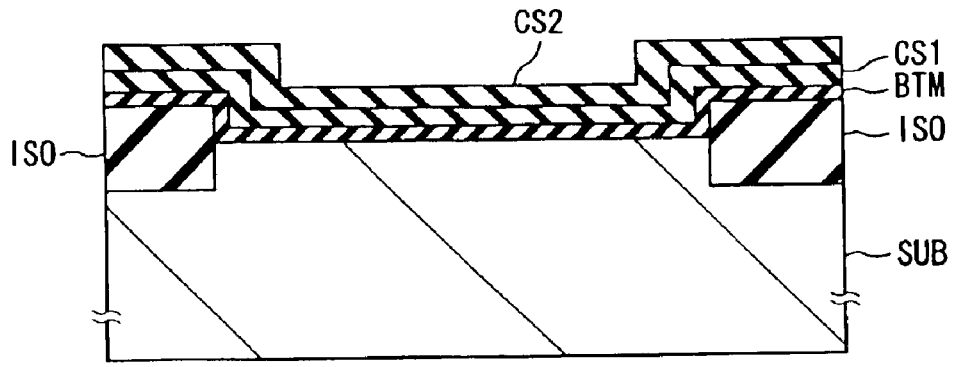

Then, the starting material gas is changed and CVD is carried out to form the second nitride film CS2. Namely, CVD of the silicon nitride is carried out while holding the same substrate temperature or changing the substrate temperature within a range of from 600° C. to 800° C. according to need and passing dichlorosilane $SiH_2Cl_2$ and ammonia $NH_3$ with predetermined flow rates within the range of from 10 sccm to 500 sccm and under a condition that the pressure in the chamber becomes several hundreds of mTorr. When the CVD is stopped after an elapse of the predetermined time, as shown in FIG. 3D, a silicon nitride film (second nitride film CS2) of several nm is formed on the first nitride film CS1.

Figure 3E:
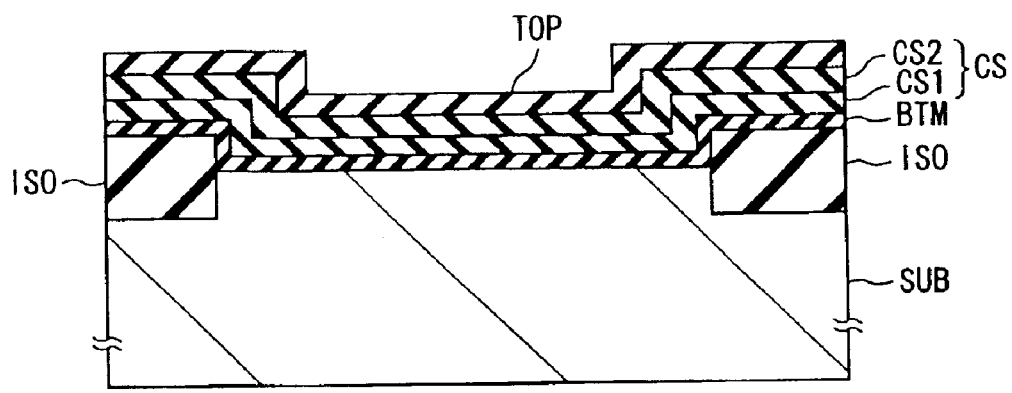

Further, CVD is carried out by changing the introduced gas to a silicon dioxide-forming gas to form the top dielectric film TOP. Namely, CVD of the silicon nitride is carried out while holding the same substrate temperature or changing the substrate temperature within a range of from 600° C. to 800° C. according to need and passing dichlorosilane $SiH_2Cl_2$ and dinitrogen oxide $N_2O$ with predetermined flow rates of several hundreds sccm and under a condition that the pressure in the chamber becomes several hundreds of mTorr. When the CVD is stopped after an elapse of the predetermined time, as shown in FIG. 3E, a silicon dioxide film (top dielectric film TOP) is formed on the second nitride film CS2.

Note that it is also possible to form the top dielectric film TOP by thermal oxidation of the second nitride film CS2 surface or a combination of thermal oxidation and CVD in place of this CVD. Taking the film loss of the second nitride film CS2 at the time of this thermal oxidation into account, the second nitride film CS2 is deposited thicker than the final film thickness in advance in the step of FIG. 3D.

Figure 3F:
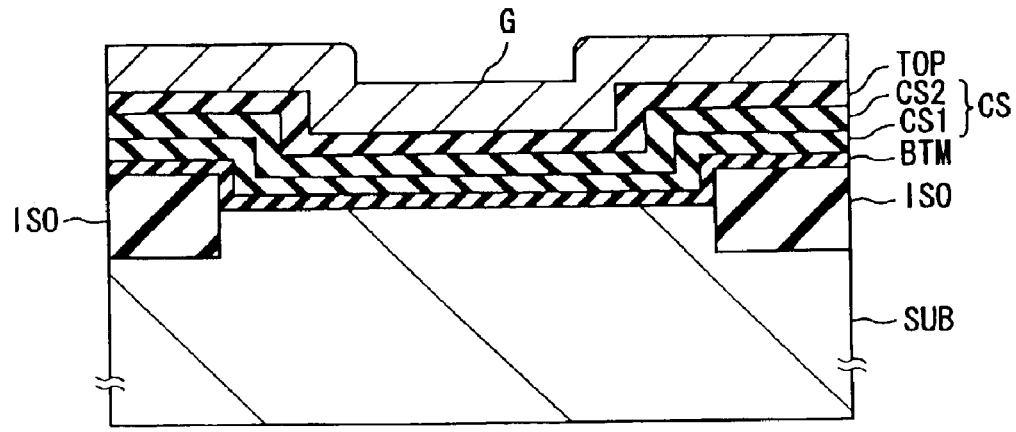

Polycrystalline silicon doped with a high concentration impurity for forming the gate electrode G is formed by CVD on the top dielectric film TOP. At the formation of this polycrystalline silicon, use is made of CVD using monosilane ($SiH_4$), dichlorosilane ($SiCl_2H_2$), tetrachlorosilane ($SiCl_4$), or another gas containing silicon atoms as the starting material or a sputtering process targeting the polycrystalline silicon. Here, the polycrystalline silicon is deposited by CVD setting the substrate temperature at 650° C., and a low resistance layer made of a metal, a high melting point metal, an alloy containing a metal silicide thereof, or the like is formed on the polycrystalline silicon according to need. As the material of the low resistance layer, use is made of copper (Cu), aluminium (Al), gold (Au), tungsten (W), titanium (Ti), tungsten silicide ($SWi_2$), tantalum silicide ($TaSi_2$), titanium nitride (TiN), or the like. The thickness of the gate electrode G formed in this way is about 50 nm to 200 nm (FIG. 3F).

Figure 3G:
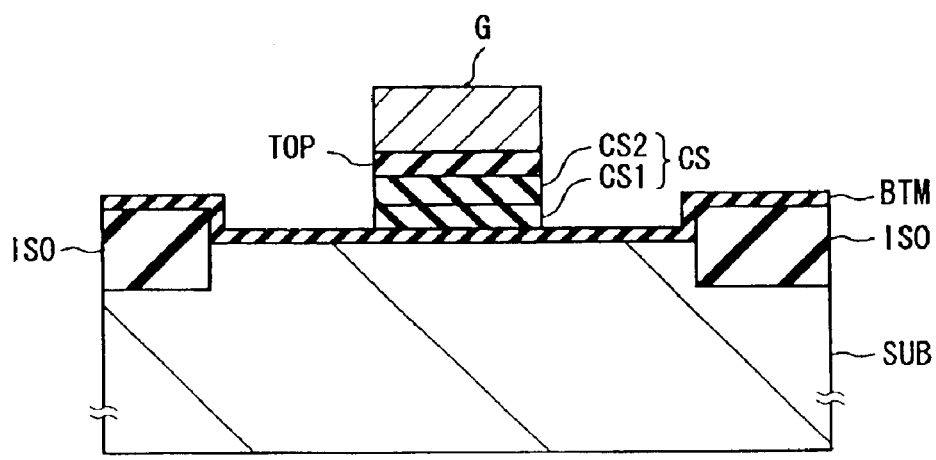

Although not particularly illustrated, a pattern of dielectric film having an excellent dry etching endurance is formed according to need, and etching having anisotropy for example RIE (reactive ion etching) is carried out using this dielectric film or resist as a mask. By this, as shown in FIG. 3G, the gate electrode G, top dielectric film TOP, and charge storage film CS are patterned.

Next, using the gate stacked film as a self-alignment mask and using the bottom dielectric film BTM as a through film, an n-type impurity is ion implanted into the surface of the Si active region with a low concentration to form the $^-$ impurity regions (LDD regions, indicated by $^-$ in the figure). At this ion implantation, for example arsenic ions ($As^+$) are doped with a density of about 1 to $5 \times 10^{13}$ $cm^{-2}$.

Figure 3H:
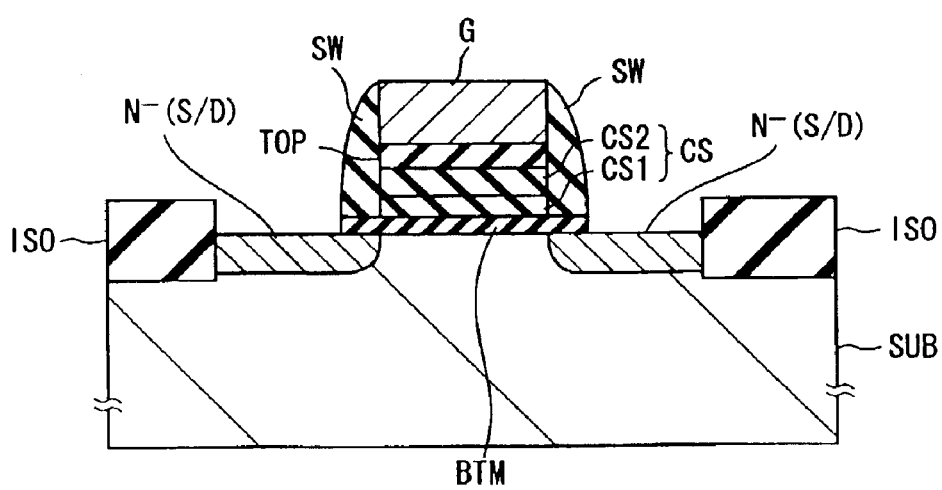

Thereafter, an $SiO_2$ film is deposited over the entire surface to about 100 nm to 200 nm by CVD, then this is etched back by RIE or other anisotropic etching. By this, as shown in FIG. 3H, sidewalls SW are formed on side surfaces of the gate stacked film G, TOP, and CS.

In this state, an n-type impurity is ion implanted into the Si active region at the outsides of the sidewalls SW with a high concentration to form the source and drain impurity regions S/D (FIG. 1). At this ion implantation, for example $As^+$ is doped by self-alignment to a density of about 1 to $5 \times 10^{15}$ $cm^{-2}$ using the gate stacked film and the sidewalls SW as the mask.

Next, the inter-layer dielectric film and the interconnection layer are formed to complete the memory transistor.

Next, an explanation will be made of a first example of setting a bias and the operation of a memory transistor according to the first embodiment.

At the time of writing, the two source and drain regions S/D are held at 0V using the potential of the substrate SUB as a reference, and a positive voltage, for example, 10V is supplied to the gate electrode G. At this time, electrons are stored in the channel formation region CH and an inversion layer is formed. Part of the electrons in that inversion layer are propagated through the bottom dielectric film BTM and the first nitride film CS1 by the tunnel effect and trapped by the charge traps mainly formed in the second nitride film CS2.

At the time of reading, 0V is supplied to one of the source and drain regions S/D using the potential of the substrate SUB as a reference, for example 1.5V is supplied to the other, and a voltage within a range where the number of electrons trapped in the charge storage film CS does not changed until an influence is exerted upon the threshold voltage, for example, 2.5V, is supplied to the gate electrode G. Under this bias condition, the conduction rate of the channel conspicuously changes in accordance with the presence of trapped electrons or the amount of trapped electrons in the charge storage film CS. Namely, when a sufficient number of electrons are injected in the charge storage film CS, the stored electrons relatively raise the potential of the channel in comparison with a case where electrons are not sufficiently injected in the charge storage layer CS and the electron density in the channel is reduced, so the degree of conduction between the source and drain is small. Conversely, when a sufficient number of electrons are not injected in the charge storage film CS, the potential of the channel is relatively low and the degree of conduction between the source and drain becomes large. The difference of the degree of conduction of the channel is effectively converted to an amount of current of the channel or a change of the drain voltage. The amount of current of the channel or the change of the drain voltage is amplified by for example a sense amplifier or other detection circuit and read out to the outside as the stored information.

Note that, in this first example of setting the bias, the write operation was carried out on the entire surface of the channel, so the read operation is possible even if the directions of application of voltage of the source and the drain are reversed to those described above.

At the time of erasure, 0V is supplied to both of two source and drain regions S/D using the potential of the substrate SUB as a reference and a negative voltage, for example −10V, is supplied to the gate electrode G. At this time, electrons held in the charge storage film CS are forcibly drained to the channel formation region CH by tunneling through the bottom dielectric film BTM and the first nitride film CS1. By this, the memory transistor is returned to a state before writing (erased state) where the amount of electrons trapped in the charge storage film CS is sufficiently low.

Next, an explanation will be made of a second example of setting the bias and operation of the memory transistor according to the first embodiment.

At the time of writing, 0V is supplied to one of two source and drain regions S/D, 5V is supplied to the other using the potential of the substrate SUB as a reference, and a positive voltage, for example 10V, is supplied to the gate electrode G. At this time, electrons are stored in the channel formation region CH and an inversion layer is formed. Electrons supplied from the source are accelerated in that inversion layer by the electric field between the source and drain to obtain a high movement energy on the drain end side and become hot electrons. When part of the hot electrons has an energy higher than the potential barrier height mainly defined by the first nitride film CS1, these electrons pass through the bottom dielectric film BTM by a scattering process, ride over the potential barrier of the first nitride film CS1 by the tunnel effect, and are trapped by the charge traps mainly formed in the second nitride film CS2.

The read operation is carried out in the same way as that of the first example of setting the bias. Note, in the second example of setting the bias, the charge is stored on the drain side to which 5V was supplied at the time of writing, so it is necessary to supply the voltage between the source and drain so that this charge storage side becomes the source at the time of the read operation.

At the time of erasure, use is made of FN tunneling in the same way as the time of the first example of setting the bias or use is made of band-band tunneling. In the latter method, 5V is supplied to one or both of the source and drain regions S/D with the substrate potential as a reference, the source and drain region S/D to which 5V is not supplied is held at 0V, and −5V is supplied to the gate electrode G. The surface of the source and drain region S/D to which 5V was supplied is depleted, and the interior of that depletion layer becomes a high electric field, so a band-band tunnel current is generated. Positive holes due to the band-band tunnel current are accelerated in the electric field and obtain a high energy. The positive holes of high energy are attracted by the gate voltage and injected into the charge traps inside the charge storage film CS. As a result, the stored electrons in the charge storage film are canceled in their charge by the injected positive holes, and the memory transistor is returned to the erased state, that is, the state where the threshold voltage is low.

Next, an explanation will be made of a third example of setting the bias and the operation of the memory transistor according to the first embodiment. The basics of setting the bias are similar to the second example of setting the bias, but the operation for storing 2 bits in one memory transistor will be explained in this third example of setting the bias.

At the time of writing of first information, 0V is supplied to one of the two source and drain regions S/D and 5V is supplied to the other using the potential of the substrate SUB as a reference, and a positive voltage, for example, 10V is supplied to the gate electrode G. At this time, electrons are stored in the channel formation region CH and an inversion layer is formed. Electrons supplied from the source are accelerated in that inversion layer by the electric field between the source and drain to obtain a high movement energy on the drain end side and become hot electrons. When part of the hot electrons has an energy higher than the potential barrier height mainly defined by the first nitride film CS1, these electrons pass through the bottom dielectric film BTM by a scattering process, ride over the potential barrier of the first nitride film CS1 by the tunnel effect, and are trapped by the charge traps mainly formed in the second nitride film CS2.

At the time of writing of second information, the voltages of the two source and drain regions S/D are reversed to those at the time of writing of the first information described above. At the time of writing of the first information described above, channel hot electrons are injected from the source and drain region S/D side to which 5V was supplied and electrons are trapped in part of the region centered on the other end of the charge storage film CS. As opposed to this, in writing this second information, in order to write binary information (second information) into one end side of the charge storage film CS independently from the first information, 0V is supplied to the other of the two source and drain regions S/D and 5V is supplied to the first one of them. The electrons supplied from the other source and drain region S/D to which 0V was supplied become hot electrons at the one source and drain region S/D side to which 5V was supplied and are injected into part of one side of the charge storage film. Note that the amount of injection of electrons and the gate length of the memory transistor are determined so that two 2 bits of information are not superimposed on each other in this third example of the operation.

At the read operation of the 2 bits of information, the directions of application of voltage between the source and drain are determined so that the source and drain region S/D nearer the side where the information to be read is written becomes the source.

When reading the first information, 0V is supplied to the other source and drain region S/D near the first information, 1.5V is supplied to the one source and drain region S/D, and a voltage within a range where the number of electrons trapped in the charge storage film CS is not changed until an influence is exerted upon the threshold voltage, for example 2.5V, is supplied to the gate electrode G. Under this bias condition, the conduction rate of the channel conspicuously changes in accordance with the presence of the trapped electrons at the source side end in the charge storage film CS or the amount of trapped electrons. Namely, when electrons have been sufficiently injected in the source side end of the charge storage film CS, the stored electrons relatively raise the potential of the source side portion of the channel and reduce the electron density in the channel in comparison with the case where electrons are not sufficiently injected in the source side end of the charge storage film CS, so the degree of conduction between the source and drain is small. At this time, in the vicinity of the drain side, the potential with respect to the electrons becomes low due to the drain voltage irrespective of the presence of the electrons of the drain side end of the charge storage film CS. Further, the drain end becomes pinched off at the time of this read operation, so the influence of the presence of electrons of the drain side end of the charge storage film CS exerted upon the degree of conduction of the channel becomes small. Namely, the threshold voltage of the transistor becomes one reflecting the amount of the trapped electrons on the source side of the low electric field, so the first information is read by the detection circuit under this first bias condition.

On the other hand, when reading the second information, 0V is supplied to one source and drain region S/D near the second information, 1.5V is supplied to the other source and drain region S/D, and 2.5V is supplied to the gate electrode G. Under this bias condition, one source and drain region S/D side becomes the low electric field, so the second information is read out by a principle similar to that at the time of the reading of the first information described above.

At the time of erasure, use is made of FN tunneling in the same way as that at the time of the first bias setting or use is made of band-band tunneling in the same way as that at the time of the second bias setting.

The memory transistor according to the first embodiment is characterized in the point that the charge storage film CS is comprised of a plurality of nitride films CS1 and CS2.

The types of the silicon-containing gas used when forming the first and second nitride films CS1 and CS2 by CVD are different. As described above, use is made of tetrachlorosilane $SiCl_4$ as the silicon-containing gas at the time of formation of the first nitride film CS1 and use is made of dichlorosilane $SiH_2Cl_2$ as the silicon-containing gas when forming the second nitride film CS2.

In the specification of the present application, the nitride film prepared by using tetrachlorosilane (TCS) $SiCl_4$ as the silicon-containing gas will be referred to as a TCS—SiN film, and the nitride film prepared by using dichlorosilane (DCS) $SiH_2Cl_2$ as the silicon-containing gas will be referred to as a DCS—SiN film.

According to the difference of whether the starting material gas is tetrachlorosilane $SiCl_4$ or dichlorosilane $SiH_2Cl_2$, a difference appears in the silicon dangling bond density in the nitride film. In general, among four bond arms of silicon, a not yet bonded arm will be referred to as a silicon dangling bond. A silicon dangling bond in the nitride film exerts an influence upon trapping of free electrons and the degree of electric conduction. The larger the silicon dangling bond density, the larger the charge trap density and the larger the degree of electric conduction in the film.

Figure 4A:
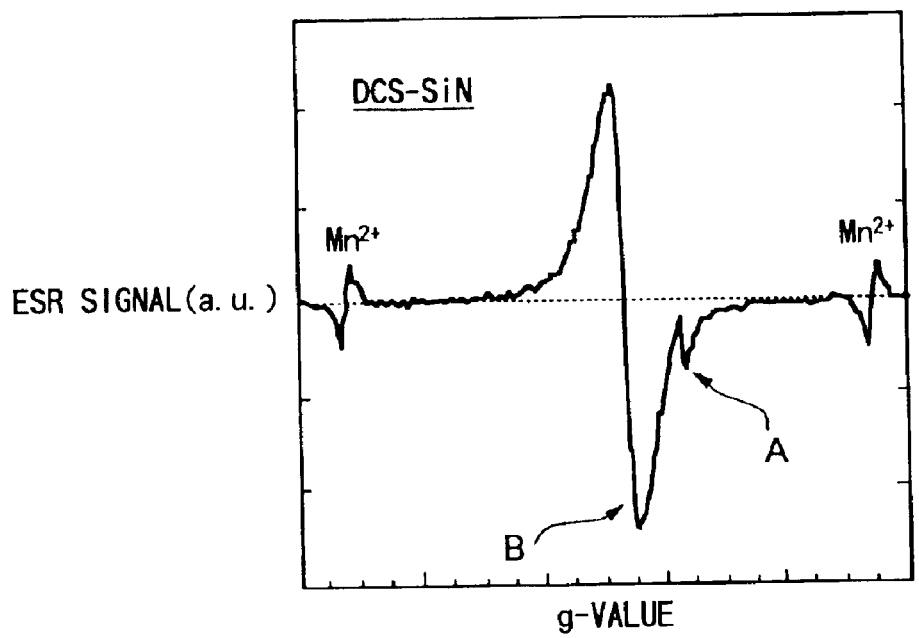
FIG. 4A and FIG. 4B are views showing an example of an ESR measurement result for measuring a silicon dangling density.
Figure 4B:
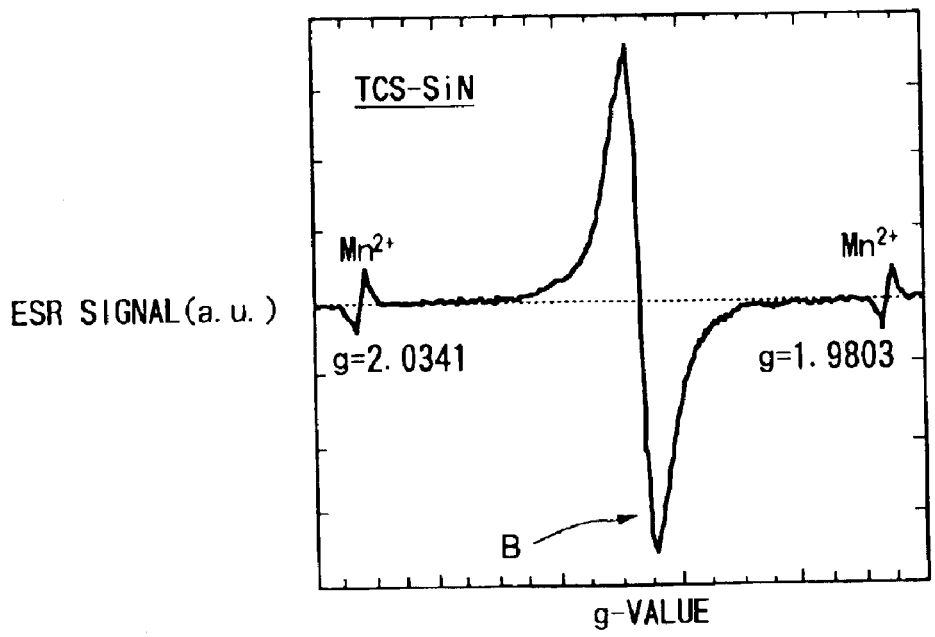

The silicon dangling bonds are an amount observed in ESR (electron spin resonance) measurement. FIG. 4A and FIG. 4B show an example of differential type signal waveforms in the ESR measurement of the DCS-SiN film and the TCS-SiN film.

FIG. 4A shows measurement results of a sample comprised of a silicon substrate formed with a stacked film of a silicon dioxide film of 1 nm and a DCS-SiN film of 8 nm, and FIG. 4B shows measurement results of a sample comprised of a silicon substrate formed with a stacked film of a silicon dioxide film of 1 nm and a TCS-SiN film of 8 nm.

It is seen from FIG. 4A and FIG. 4B that a peak A not observed in the TCS-SiN film appears in the DCS-SiN film. Namely, it is seen that a silicon dangling bond not contained in the TCS-SiN film exists in the DCS-SiN film. Note that, it is considered that a peak B common to the DCS-SiN film and the TCS-SiN film is due to a silicon dangling bond of the silicon substrate.

Figure 5:
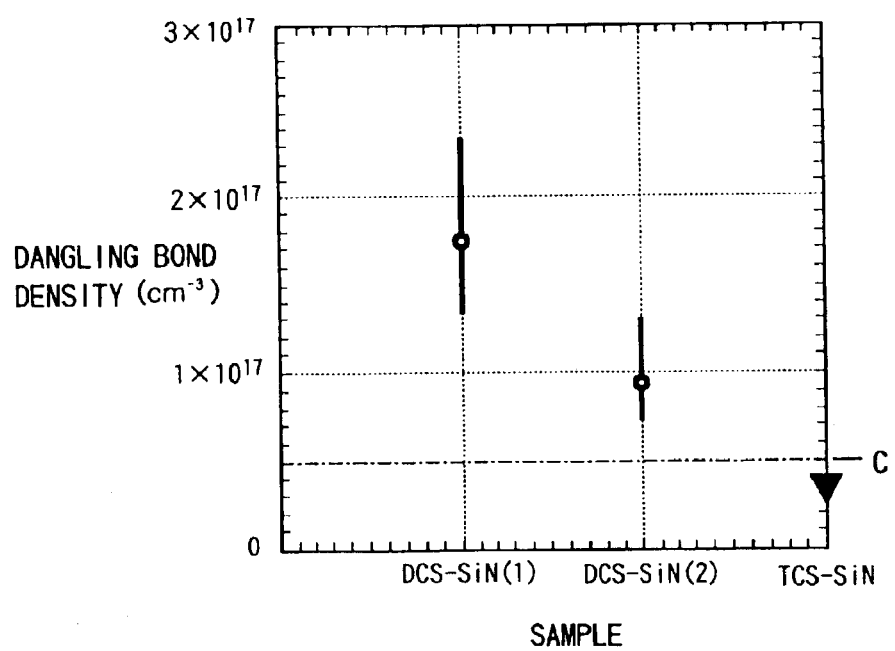
FIG. 5 is a graph showing an example of the silicon dangling density found from the ESR measurement shown in FIG. 4A and FIG. 4B.

By calculating integration type signal waveforms from the differential type signal waveforms of ESR shown in FIG. 4A and FIG. 4B and calculating the area of the related integration type signal waveforms, the silicon dangling bond density is calculated. FIG. 5 shows an example of a result of calculation of the silicon dangling bond densities of the DCS-SiN film and the TCS-SiN film.

In FIG. 5, two different samples cut out from the same wafer formed with the DCS-SiN film are measured for the results of calculation of the silicon dangling bond density of the DCS-SiN film and defined as DCS-SiN (1) and DCS-SiN (2).

As shown in FIG. 5, the silicon dangling bond densities of the DCS-SiN films (1) and (2) are $1.74 \times 10^{17}$ cm$^{-3}$ and $0.95 \times 10^{17}$ cm$^{-3}$, while the silicon dangling bond density of the TCS-SiN film is not more than the $0.5 \times 10^{17}$ cm$^{-3}$ Of the detection limit C.

From the measurement results of a plurality of samples, the silicon dangling bond density of the DCS-SiN film can be adjusted by changing the flow rate of the starting material gas and the film forming conditions such as the CVD temperature. The range thereof was approximately $0.70 \times 10^{17}$ cm$^{-3}$ or more.

Figure 6:
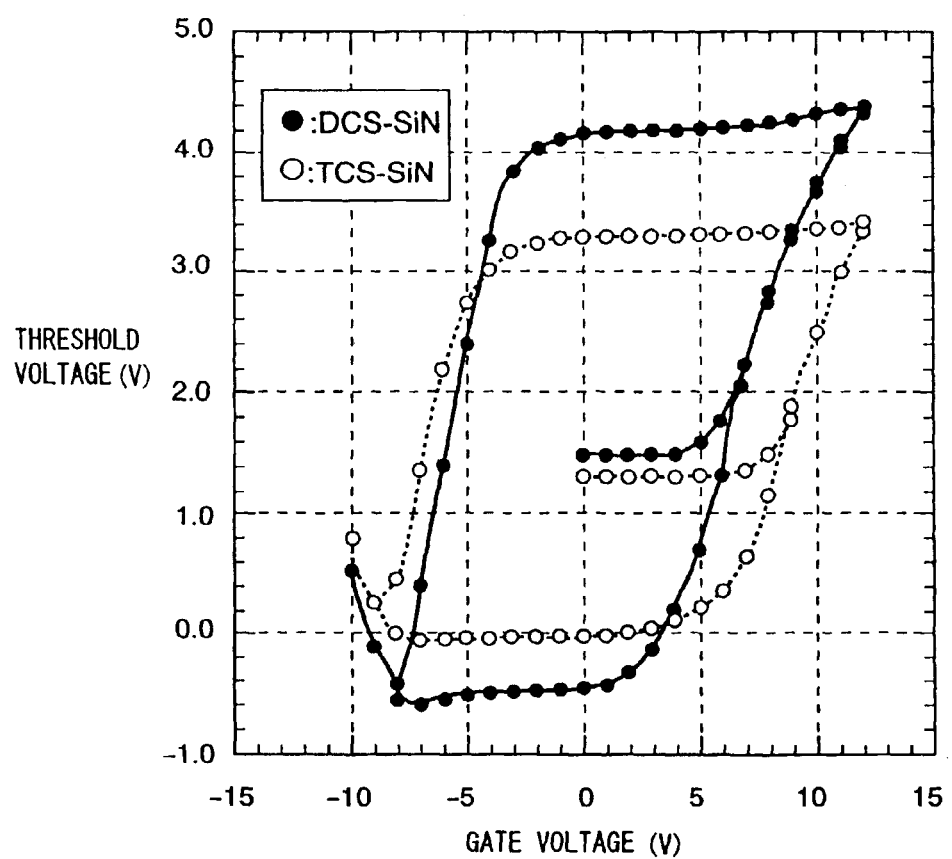
FIG. 6 is a graph showing an example of a memory hysteresis characteristic of a memory transistor having a first nitride film or a second nitride film.

On the other hand, the difference of the charge trap density between the TCS-SiN film and the DCS-SiN film can be confirmed from the memory hysteresis characteristic shown in FIG. 6.

In this measurement, a memory transistor containing silicon nitride (TCS-SiN) prepared by using tetrachlorosilane $SiCl_4$ as a single charge holding film and a memory transistor containing silicon nitride (DCS-SiN) prepared by using dichlorosilane $SiH_2Cl_2$ as a single charge holding film were compared. As a result of the comparison, it was seen that a threshold window of the memory transistor having DCS-SiN was larger than the threshold window of the memory transistor having TCS-SiN by about 1.5V.

When calculating the charge density from this result, the stored electron density became $9.9 \times 10^{18}$ cm$^3$ and the stored positive hole density became $7.2 \times 10^{18}$ cm$^3$ with DCS-SiN, and the stored electron density became $7.2 \times 10^{18}$ cm$^3$ and the stored positive hole density became $4.2 \times 10^{18}$ cm$^3$ with TCS-SiN.

Accordingly, when converting this to the charge density, DCS-SiN has a larger stored electron density than TCS-SiN by about 40% and has a stored positive hole density larger than the latter by about 70%. Note that, it is possible to further enlarge this charge density difference by changing the film forming conditions etc.

The above measurement results can be understood as follows. Namely, tetrachlorosilane $SiCl_4$ has a larger percent composition of chlorine than dichlorosilane $SiH_2Cl_2$, so the first nitride film CS1 has a higher content of chlorine than the second nitride film CS2. Accordingly, in the first nitride film CS1, many silicon-chlorine bond radicals (Si—Cl bond) having a larger coupling energy than the silicon-hydrogen bond radicals (Si—H bond) and being stable are contained in the silicon nitride, so the first nitride film CS1 has a lower silicon dangling bond density in comparison with the second nitride film CS2.

On the other hand, in the DCS-SiN film immediately after the formation, a larger amount of Si—H bonds than in the TCS-SiN film immediately after formation are contained. The Si—H bonds have a high possibility of generating silicon dangling bonds in the process of escape of the hydrogen.

Accordingly, the silicon dangling bond density of the nitride film CS2 (DCS-SiN film) prepared by using dichlorosilane $SiH_2Cl_2$ becomes higher than the silicon dangling bond density of the nitride film CS1 (TCS-SiN film) prepared by using tetrachlorosilane $SiCl_4$, and the Si—H bond density and the charge trap density have a positive correlation, so also the charge trap density becomes high in accordance with that.

In the memory transistor according to the present embodiment, DCS-SiN (or DCS-SiON) having a high silicon dangling bond density is isolated from the semiconductor substrate SUB by arranging TCS-SiN (or TCS-SiON) having a low silicon dangling bond density on the semiconductor substrate SUB side. Accordingly, when the thickness of the charge storage film CS in the silicon dioxide film conversion is the same as the conventional thickness, the mean location of the charge traps on an axis vertical to the channel formation region CH moves to the gate electrode G side from that in the conventional case. As a result, the held charges become hard to escape to the channel side, so the charge holding characteristic is improved. Further, the thickness of the charge storage film CS per se when the charge holding characteristic the same as that of the conventional one is obtained can be reduced, and the voltage to be supplied to the gate can be lowered by that amount or the write or erase operation becomes faster.

When injecting electrons into the charge storage film CS, the potential barrier height formed by the silicon dioxide (bottom dielectric film BTM) with respect to electrons in a channel formation region made of silicon, that is, the energy difference of the conduction band end of the silicon and the conduction band end of the silicon dioxide, becomes one of the parameters determining the gate voltage value required for the injection. In the case of the conventional structure, that is, when the charge storage film is a single layer film, the potential barrier height of the silicon dioxide with respect to the electrons inside the channel was about 3.2 eV. For this reason, it becomes necessary to raise the electric field in the bottom dielectric film BTM up to the region where the FN tunneling occurs, that is, 7 MeV/cm or more in terms of the electric field intensity of the film thickness direction. Further, when performing hot electron injection writing, the voltage for raising the energy of electrons inside the channel up to the potential barrier height 3.2 eV or more must be supplied between the source and drain. These became factors preventing the lowering of the operating voltage.

In the memory transistor according to the present embodiment, when the difference of the silicon dangling bond density is made sufficiently large between the first nitride film CS1 and the second nitride film CS2, the second nitride film CS2 acts as the main charge storing means, and the first nitride film CS1 does not act so much as a charge storing means. As a result, the first nitride film CS1 existing between the second nitride film CS2 and the semiconductor substrate SUB has an increased role as a potential barrier. This results in the advantage that the bottom dielectric film BTM conventionally having a limit for reducing the thickness to about 3 nm can be made thinner to about 1 nm. When the bottom dielectric film thickness is reduced to 1 nm, it does not act much at all as a potential barrier, so the potential barrier of the memory transistor required in that case is mainly ensured by the presence of the first nitride film CS1. As described above, the potential barrier height of the silicon dioxide film conventionally used as the bottom dielectric film BTM is 3.2 eV, but the potential barrier height of TCS-SiN is as low as 2.1 eV at the maximum. For this reason, even in a case where the thickness of the charge storage film CS is designed so that a charge holding characteristic the same as the conventional one is obtained, the injection efficiency of carriers to the charge storage film CS is improved, the operating voltage can be lowered, or the device operates at a high speed.

Figure 7:
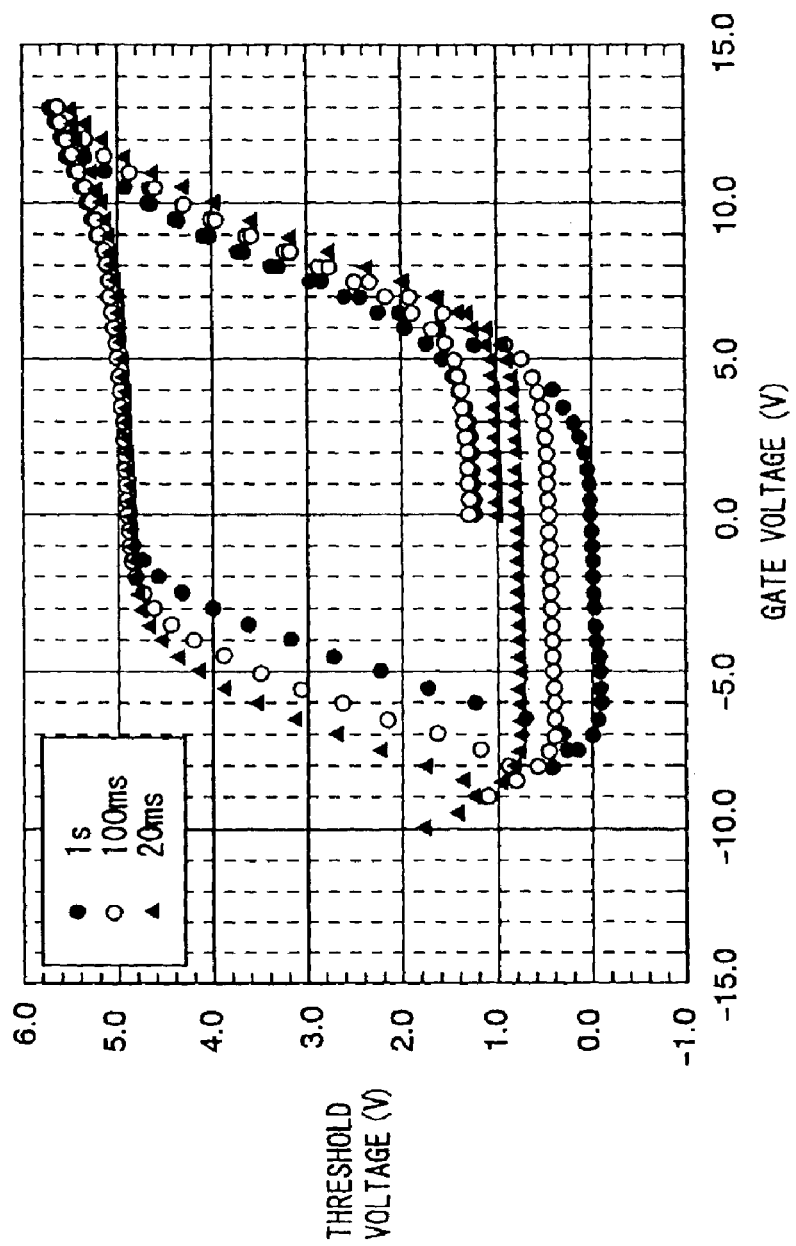
FIG. 7 is a graph showing an example of the memory hysteresis characteristic of a memory transistor according to the first embodiment.
Figure 8:
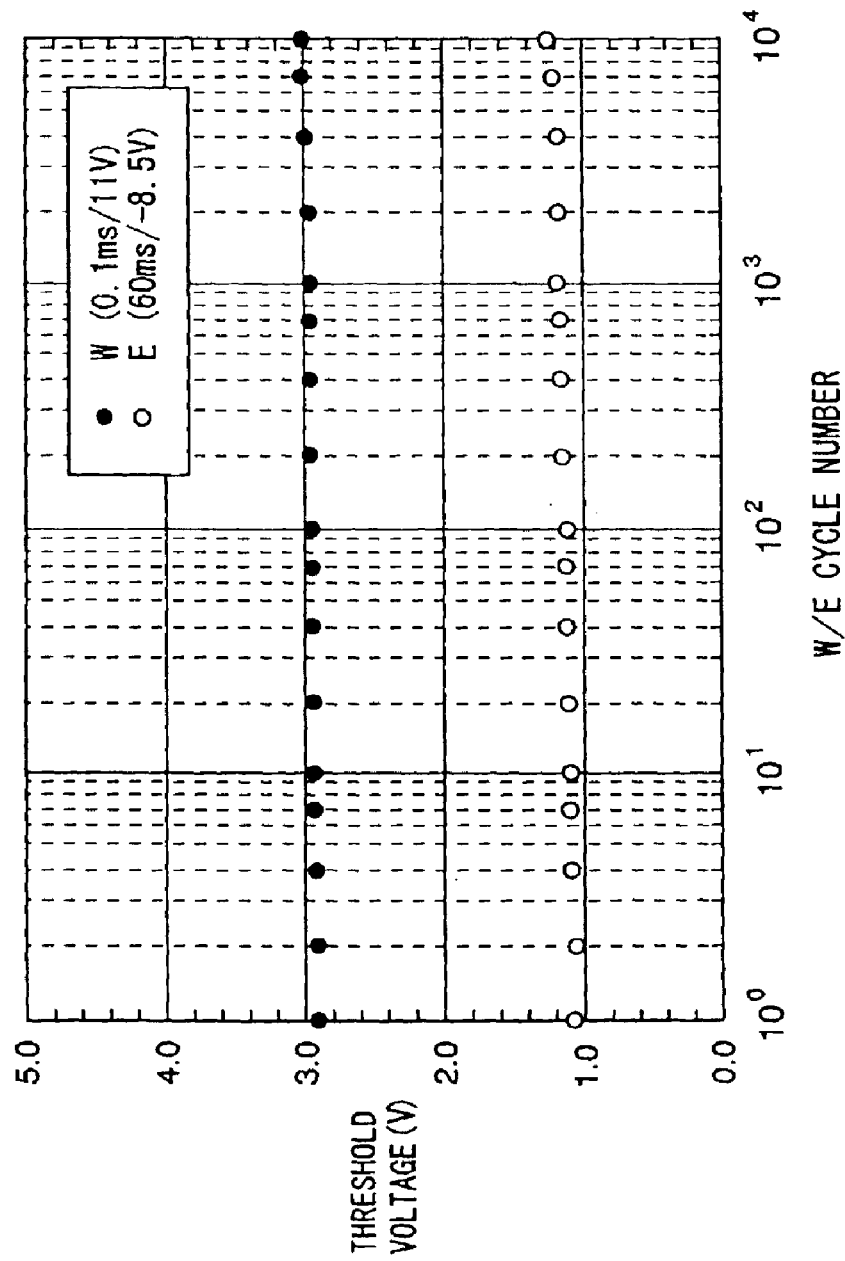
FIG. 8 is a graph showing an example of an endurance characteristic of a memory transistor according to the first embodiment.

The characteristics of a non-volatile memory transistor prepared by using the production method according to the first embodiment is shown in FIG. 7 and FIG. 8.

FIG. 7 is a view of an example of the memory hysteresis characteristic of the non-volatile memory transistor according to the first embodiment.

The abscissa of FIG. 7 shows the gate voltage when writing or erasing information by setting the source and drain and substrate potentials at 0V and using FN tunneling from the entire surface of the channel. The ordinate of FIG. 7 shows the threshold voltage of the memory transistor after supplying the gate voltage. The numerical figures in the graph are application times of the pulses supplied to the gate for the writing or erasing. It is seen from this graph that a sufficient threshold window is obtained when the erasing time is 20 ms.

FIG. 8 is a view of an example of an endurance characteristic of the non-volatile memory transistor according to the first embodiment.

The endurance characteristic shown in FIG. 8 indicates the change of the threshold voltage when an operation of adding a gate voltage of 11V for 0.1 ms at the time of writing and adding a gate voltage of −8.5V for 60 ms at the time of erasing is repeated. It is seen that there is no large change in the threshold voltage up to $10^4$ times and the threshold window of about 2V is maintained. In the conventional MONOS type memory transistor wherein the nitride film has a single ONO film, 1 ms was required at the time of writing and 100 ms was required at the time of erasing, but it is seen that the write and erase operations are possible in a shorter time than the conventional time in the MONOS type memory transistor according to the present embodiment.

Below, an explanation will be made of a case where the formation gas of the second nitride film CS2 is changed in the second and third embodiments. In these embodiments, the basic element structure of FIG. 1 and FIG. 2 and the sectional views in the production of FIG. 3A to FIG. 3H are applied as they are.

Second Embodiment

In the method of producing the memory transistor according to the second embodiment, the same steps are carried out in the same way as the first embodiment up to the formation of the first nitride film CS1 of FIG. 3A to FIG. 3C.

In the formation of the second nitride film CS2 of FIG. 3D, CVD of silicon nitride is carried out by passing monosilane $SiH_4$ and ammonia $NH_3$ by predetermined flow rates within a range of from 10 sccm to 500 sccm and under a condition that the pressure in the chamber becomes several hundreds of mTorr while holding the substrate temperature the same as that at the time of formation of the first nitride film CS1 or changing it according to need within a range of from 600° C. to 800° C. When the CVD is stopped after the elapse of a predetermined time, a silicon nitride film (second nitride film CS2) of several nm is formed on the first nitride film CS1.

Thereafter, by a similar method to that of the first embodiment, the various steps of the formation of the top dielectric film TOP, formation of the gate electrode G, gate processing, formation of LDDs, formation of the sidewalls SW, formation of the source and drain regions S/D, etc. are carried out to complete the memory transistor.

Third Embodiment

In the method of producing a memory transistor according to the third embodiment, the same steps are carried out in the same way as the first embodiment up to the formation of the first nitride film CS1 of FIG. 3A to FIG. 3C.

In the formation of the second nitride film CS2 of FIG. 3D, CVD of silicon nitride is carried out by passing silane trichloride $SiHCl_3$ and ammonia $NH_3$ by predetermined flow rates within a range from 10 sccm to 500 sccm and under a condition that the pressure in the chamber becomes several hundreds of mTorr while holding the substrate temperature the same as that at the time of formation of the first nitride film CS1 or changing it according to need within a range of from 600° C. to 800° C. When the CVD is stopped after the elapse of a predetermined time, a silicon nitride film (second nitride film CS2) of several nm is formed on the first nitride film CS1.

Thereafter, by a similar method to that of the first embodiment, the various steps of the formation of the top dielectric film TOP, formation of the gate electrode G, gate processing, formation of LDDs, formation of the sidewalls SW, formation of the source and drain regions S/D, etc. are carried out to complete the memory transistor.

Fourth Embodiment

Figure 9:
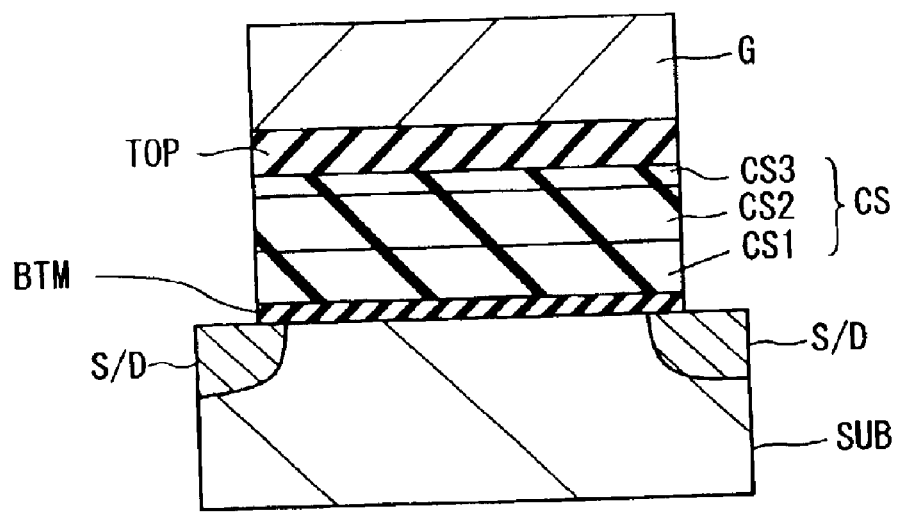
FIG. 9 is a view showing enlarged a first principal part of FIG. 1 showing a detailed example of the structure of the charge storage layer in a memory transistor according to a fourth embodiment.

The fundamental structure of the memory transistor according to the fourth embodiment is similar to that of FIG. 1. FIG. 9 is a sectional view enlarging a principal part of the memory transistor according to the fourth embodiment.

The difference of this memory transistor from those of the first to third embodiments resides in the point that the charge storage layer CS has a triple layer structure. The charge storage film CS further has a third nitride film CS3 on the first and second nitride films CS1 and CS2 in the same way as those of the first to third embodiments. The other structures, that is, the structures of the substrate SUB, bottom dielectric film BTM, top dielectric film TOP, and gate electrode G, materials, and formation methods are substantially the same as those of the first embodiment.

The third nitride film CS3 in the fourth embodiment is made of a nitride film prepared by using tetrachlorosilane $SiCl_4$, and the top dielectric film TOP on that is made of silicon dioxide formed by pyrogenically oxidizing the surface of the third nitride film CS3.

As shown in FIG. 3A to FIG. 3D, methods similar to those of the first to third embodiments are used to form the dielectric isolation layers ISO, bottom dielectric film BTM, first nitride film CS1, and second nitride film CS2.

Thereafter, in a step corresponding to FIG. 3E, first, the substrate temperature is held within the range of from 600° C. to 800° C., and CVD of the silicon nitride is carried out by passing tetrachlorosilane $SiCl_4$ and ammonia $NH_3$ by predetermined flow rates within the range from 10 sccm to 500 sccm and under the condition that the pressure in the chamber becomes several hundreds of mTorr. By this, a silicon nitride film (third nitride film CS3) thicker than the final film thickness is formed on the second nitride film CS2.

Then, when the third nitride film CS3 surface is oxidized by pyrogenic oxidation, the silicon nitride of the surface portion of the third nitride film CS3 changes to silicon dioxide. Due to this, a top dielectric film TOP of several nm is formed. At this time, loss of the underlying third nitride film CS3 occurs, and the third nitride film CS3 becomes the predetermined final thickness.

Thereafter, by a similar method to that of the first embodiment, the various steps of the formation of the gate electrode G, gate processing, formation of LDDs, formation of the sidewalls SW, formation of the source and drain regions S/D, etc. are carried out to complete the memory transistor.

In the fourth embodiment, as the silicon-containing gas used for the formation of the second nitride film CS2, chlorosilane gas having a smaller percent composition of chlorine than that of the silicon-containing gas used for forming the first nitride film CS1 can be used. Further, as the silicon-containing gas used for the formation of the third nitride film CS3, use can be made of chlorosilane gas or monosilane having a larger percent composition of chlorine than that of the silicon-containing gas used for forming the second nitride film CS2. As a result, the third nitride film CS3 has a higher content of chlorine than the underlying second nitride film CS2 mainly providing a charge storage function. In general, in the silicon nitride film, the diffusion coefficient of atoms is smaller than that in silicon dioxide. Particularly in a silicon nitride film having an increased chlorine content, many Si—Cl bonds having a larger bonding energy than that of Si—H bonds are contained, so a higher density film is formed, and the diffusion coefficient is further smaller. For this reason, the diffusion of the hydrogen in the second nitride film CS2 of the charge storage layer is prevented by the third nitride film CS3. This is not absorbed by the silicon dioxide film comprising the top dielectric film TOP of the uppermost layer. Accordingly, in the memory transistor according to the fourth embodiment, there is an advantage that aging of the device characteristics is suppressed and a stable memory characteristic is obtained.

Note that, in the fourth embodiment, since the third nitride film CS3 was provided on the second nitride film CS2 mainly holding the charge, the thickness of the top dielectric film TOP can be made smaller than that of the cases of the first to third embodiments.

In the fourth embodiment, it is also possible to use CVD in place of pyrogenic oxidation in the formation of the top dielectric film TOP. In this case, the CVD of the silicon dioxide is carried out by holding the substrate temperature within the range of from 600° C. to 800° C. and passing dichlorosilane $SiH_2Cl_2$ or tetrachlorosilane $SiCl_4$ and dinitrogen oxide $N_2O$ by predetermined flow rates of several hundred sccm and under a condition that the pressure in the chamber becomes several hundreds of mTorr.

The present invention is not limited to the first to fourth embodiments. Various modifications based on the technical concept of this invention are possible.

For example, it is also possible to comprise the charge storage film CS by four or more layers including at least the first nitride film CS1 having a high chlorine concentration and the second nitride film CS2 having a low chlorine concentration. Further, at the time of forming this charge storage film CS, the method includes a step of forming the first nitride film CS1 by chemical vapor deposition using a silicon-containing gas consisting of chlorosilane $SiH_{x1}Cl_{4-x1}$ (x1=1, 2), chlorodisilane $Si_2H_{y1}Cl_{6-y1}$ (y1=1, 2, 3, 4), or tetrachlorosilane $SiCl_4$ and a nitrogen-containing gas as starting materials and a step of forming the second nitride film CS2 by chemical vapor deposition using a silicon-containing gas consisting of chlorosilane $SiH_{x2}Cl_{4-x2}$ (x2>x1, x2=2, 3), chlorodisilane $Si_2H_{y2}Cl_{6-y2}$ (y2>y1, y2=2, 3, 4, 5), monosilane $SiH_4$ or disilane $Si_2H_6$ having a lower percent composition of chlorine than the silicon-containing gas used at the time of the formation of the first nitride film CS1 and a nitrogen-containing gas as starting materials. Accordingly, any silicon-containing gas may be selected within this range.

Further, according to need, the method includes a step of forming the third nitride film CS3 by chemical vapor deposition using a silicon-containing gas consisting of chlorosilane $SiH_{x3}Cl_{4-x3}$ (x3<x2, x3=1, 2), chlorodisilane $Si_2H_{y3}Cl_{6-y3}$ (y3<y2, y3=1, 2, 3, 4) or tetrachlorosilane $SiCl_4$ having a higher percent composition of chlorine than the silicon-containing gas used at the time of the formation of the second nitride film CS2 and a nitrogen-containing gas as starting materials. Accordingly, any silicon-containing gas at the time of the formation of the third nitride film CS3 may be selected within this range.

The bottom dielectric film BMT and top dielectric film TOP are not limited to silicon dioxide and can be formed by any material of for example silicon nitride $SiN_x$, silicon oxynitride $SiN_xO_y$, aluminium oxide $Al_2O_3$, tantalum oxide $Ta_2O_5$, zirconium oxide $ZrO_2$, and hafnium oxide $HfO_2$ as well. It is also possible to employ a stacked film of silicon dioxide with these materials.

When aluminium oxide $Al_2O_3$ is selected as the material of the bottom dielectric film BMT or top dielectric film TOP, in the formation thereof, a CVD process using $AlCl_3$, $CO_2$, and $H_2$ as the formation gases or thermal decomposition of an aluminium alkoxide $(Al(C_2H_5O)_3, Al(C_3H_7O)_3$, or $Al(C_4H_8O)_3$ or the like) is used.

When tantalum oxide $Ta_2O_5$ is selected as the material of the bottom dielectric film BMT or top dielectric film TOP, in the formation thereof, a CVD process using $TaCl_5$, $CO_2$, and $H_2$ as the formation gases or thermal decomposition of $TaCl_2(OC_2H_5)_2C_5H_7O_2$ or $Ta(OC_2H_5)_5$ etc. is used.

When zirconium oxide $ZrO_2$ is selected as the material of the bottom dielectric film BMT or top dielectric film TOP, in the formation thereof, a method of sputtering Zr in an oxygen atmosphere is used.

When hafnium oxide $HfO_2$ is selected as the material of the bottom dielectric film BMT or top dielectric film TOP, in the formation thereof, a method of sputtering Hf in the oxygen atmosphere is used.

When silicon oxynitride $SiN_xO_y$ is selected as the material of the bottom dielectric film BMT or top dielectric film TOP, a method of exposing silicon dioxide formed by the method described above to ammonia $NH_3$ and oxidizing and nitriding the same is used. Further, as another method of forming the silicon oxynitride $SiN_xO_y$, CVD of the silicon nitride is carried out by holding the substrate temperature within the range of from 600° C. to 800° C. and passing dichlorosilane $SiH_2Cl_2$ or tetrachlorosilane $SiCl_4$ and dinitrogen oxide $N_2O$ and ammonia $NH_3$ by predetermined flow rates within the range of from 10 sccm to 500 sccm and under a condition that the pressure in the chamber becomes several hundreds of mTorr.

Note that, in any of the methods described above, use is also made of nitrogen electrolytically dissociated by an alternating current electromagnetic field of a frequency of 5 to 500 MHz as the nitrogen-containing gas.

A memory cell array is comprised of a large number of memory transistors having any of the structures described above and produced by any of the above production methods arranged in a matrix form, but there is no limitation on the cell system. In the NOR type, any of a method wherein the source line is isolated and a virtual ground cell method wherein the source line and the bit line are shared between cells in the word direction can be employed. Further, any of the so-called AND type, HiCR type, and DINOR type of one of the NOR types can be employed too. Further, adoption of the NAND type is also possible.

Industrial Applicability

The present invention can be applied to the structure and method of fabrication of a charge storage layer of a non-volatile semiconductor memory device as represented by a flash EEPROM (flash electrically erasable and programmable ROM).

| LIST OF REFERENCES | |
| --- | --- |
| SUB | Substrate (semiconductor) |
| CH | channel formation region |
| S/D | sourcedrain region |
| ISO | dielectric isolation layer |
| BTM | bottom dielectric film |
| CS | charge storage film |
| CS1 | first nitride film |
| CS2 | second nitride film |
| CS3 | third nitride film |
| TOP | top dielectric film |
| G | gate electrode |
| SW | sidewall |

What is claimed is:

1. A non-volatile semiconductor memory device comprising:
    a plurality of dielectric films containing a charge storage film (CS2) having a charge holding capability and stacked on an active region of a semiconductor substrate (SUB),
    a gate electrode formed on said plurality of dielectric films, and
    two semiconductor region (S/D) serving as the source or drain in said semiconductor substrate (SUB) on the two sides of said gate electrode (G), wherein said plurality of dielectric films contains a potential barrier film (CS1) made of silicon nitride or silicon oxynitride and said charge storage film (CS2) formed on said potential barrier film (CS1) made of silicon nitride or silicon oxynitride and having a charge trap density higher than that of said potential barrier film (CS1).

2. A memory device as set forth in claim 1, wherein said plurality of dielectric films have a first dielectric film (BTM) formed on said active region of the semiconductor substrate (SUB), said potential barrier film (CS1) formed on said first dielectric film (BTM), said charge storage film (CS2) formed on said potential barrier film (CS1), and a second dielectric film (TOP) formed on said charge storage film (CS2).

3. A memory device as set forth in claim 1, wherein said charge storage film (CS2) has a silicon dangling bond density higher than said potential barrier film (CS1).

4. A memory device as set forth in claim 3, wherein the silicon dangling bond density of said charge storage film (CS2) is equal or larger than $7\times10^{16}$ cm$^{-3}$.

5. A memory device as set forth in claim 3, wherein the silicon dangling bond density of said potential barrier film (CS1) is equal or smaller than $5\times10^{16}$ cm$^{-3}$ and the silicon dangling bond density of said charge storage film (CS2) is equal or larger than $7\times10^{16}$ cm$^{-3}$.

6. A memory device as set forth in claim 1, wherein said plurality of dielectric films have a diffusion preventing film (CS3) for preventing the diffusion of the hydrogen made of silicon nitride or silicon oxynitride and having a charge trap density lower than that of said charge storage film (CS2), between said charge storage film (CS2) and said gate electrodes (G).

7. A memory device as set forth in claim 6, wherein said plurality of dielectric films have a first dielectric film (BTM) formed on said active region of the semiconductor substrate (SUB), said potential barrier film (CS1) formed on said first dielectric film (BTM), said charge storage film (CS2) formed on said potential barrier film (CS1), said diffusion preventing film (CS3) formed on said charge storage film (CS2), and a second dielectric film (TOP) formed on said diffusion preventing film (CS3).

8. A memory device as set forth in claim 1, wherein said potential barrier film (CS1) and said charge storage film (CS2) include chlorine and said potential barrier film (CS1) has a concentration of chlorine higher than that of said charge storage film (CS2).

9. A memory device as set forth in claim 6, wherein said potential barrier film (CS1), said charge storage film (CS2), and said diffusion preventing film (CS3) contain chlorine and said potential barrier film (CS1) and said diffusion preventing film (CS3) have concentrations of chlorine higher than that of said charge storage film (CS2).

10. A memory device as set forth in claim 2 or 7, wherein said first dielectric film (BTM) includes a material of any of silicon oxide $SiO_2$, silicon oxynitride $SiN_xO_y$, aluminium oxide $Al_2O_3$, tantalum oxide $Ta_2O_5$, zirconium oxide $ZrO_2$, and hafnium oxide $HfO_2$.

11. A memory device as set forth in claim 2 or 7, wherein said first dielectric film (BTM) is formed by a silicon dioxide film of not more than 2 nm formed on the active region of said semiconductor substrate (SUB) and any material formed between said silicon dioxide film and said charge storage film (CS2) selected from silicon oxynitride $SiN_xO_y$, aluminium oxide $Al_2O_3$, tantalum oxide $Ta_2O_5$, zirconium oxide $ZrO_2$, and hafnium oxide $HfO_2$.

12. A memory device as set forth in claim 2 or 7, wherein said second dielectric film (TOP) includes any material of silicon dioxide $SiO_2$, silicon nitride $SiN_x$ silicon oxynitride $SiN_xO_y$, aluminium oxide $Al_2O_3$, tantalum oxide $Ta_2O_5$, zirconium oxide $ZrO_2$, and hafnium oxide $HfO_2$.

* * * * *